United States Patent
Hendrickson et al.

(10) Patent No.: US 9,659,624 B1
(45) Date of Patent: May 23, 2017

(54) METHOD FOR SENSE REFERENCE GENERATION FOR MTJ BASED MEMORIES

(71) Applicant: Broadcom Corporation, Irvine, CA (US)

(72) Inventors: Nick Thomas Hendrickson, Burnsville, MN (US); Myron Buer, Prior Lake, MN (US); Ron Daniel Isliefson, Lakeville, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/094,743

(22) Filed: Apr. 8, 2016

Related U.S. Application Data

(60) Provisional application No. 62/308,609, filed on Mar. 15, 2016.

(51) Int. Cl.
  *G11C 11/16* (2006.01)

(52) U.S. Cl.
  CPC ................. *G11C 11/1673* (2013.01)

(58) Field of Classification Search
  CPC ................. G11C 11/1673; G11C 11/1693
  See application file for complete search history.

(56) References Cited

U.S. PATENT DOCUMENTS

| | | | | |
|---|---|---|---|---|
| 5,754,475 A * | 5/1998 | Bill | ................. | G11C 11/5621 365/185.2 |
| 7,027,325 B2 * | 4/2006 | Iwata | ................. | G11C 11/14 365/158 |
| 8,023,311 B2 * | 9/2011 | Kim | ................. | G11C 7/062 365/148 |
| 2006/0120175 A1 * | 6/2006 | Chou | ................. | G11C 16/26 365/189.06 |
| 2014/0119105 A1 * | 5/2014 | Jan | ................. | G11C 11/16 365/158 |
| 2014/0185361 A1 * | 7/2014 | Oh | ................. | G11C 13/004 365/148 |
| 2014/0281279 A1 * | 9/2014 | Oh | ................. | G06F 3/0655 711/147 |
| 2015/0035032 A1 * | 2/2015 | Kang | ................. | H01L 27/228 257/295 |
| 2015/0262622 A1 * | 9/2015 | Iizuka | ................. | G11C 5/06 365/63 |

* cited by examiner

*Primary Examiner* — Douglas King
(74) *Attorney, Agent, or Firm* — Foley & Lardner LLP

(57) ABSTRACT

In some aspects, the disclosure is directed to methods and systems for sense reference generation. A first array and a second array of MTJ based cells are configured as a magnetoresistive random access memory block. The first array is matched to the second array, the first array and the second array each including rows of MTJ based cells for storing data bits. Responsive to a first row of MTJ based cells in the first array being selected for at least a first stored data bit to be read, a reference row of MTJ based cells in the second array is connected to at least a first comparator of a plurality of comparators via reference lines, to provide sense reference for determining a value of the first stored data bit. The reference lines are shorted together prior to connecting to a first input of the first comparator.

20 Claims, 5 Drawing Sheets

METHOD FOR SENSE REFERENCE GENERATION FOR MTJ BASED MEMORIES

RELATED APPLICATIONS

This application claims priority to and the benefit of U.S. Provisional Patent Application No. 62/308,609, filed Mar. 15, 2016. The entire contents of the foregoing are hereby incorporated herein by reference for all purposes.

FIELD OF THE DISCLOSURE

This disclosure generally relates to systems and methods of a magnetic tunnel junction based memory, including but not limited to systems and methods for implementing a magnetic tunnel junction based memory.

BACKGROUND OF THE DISCLOSURE

In the last few decades, the market for electronic devices has grown by orders of magnitude, fueled by the use of portable devices, and increased connectivity, data transfer and data storage in all manners of devices. Furthermore, circuit fabrication improvements, as well as advances in circuit integration and other aspects have made storage devices cheaper and more reliable. As changes in data storage requirements, fabrication process and other developments occur, new techniques are constantly being developed for adoption.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1A:
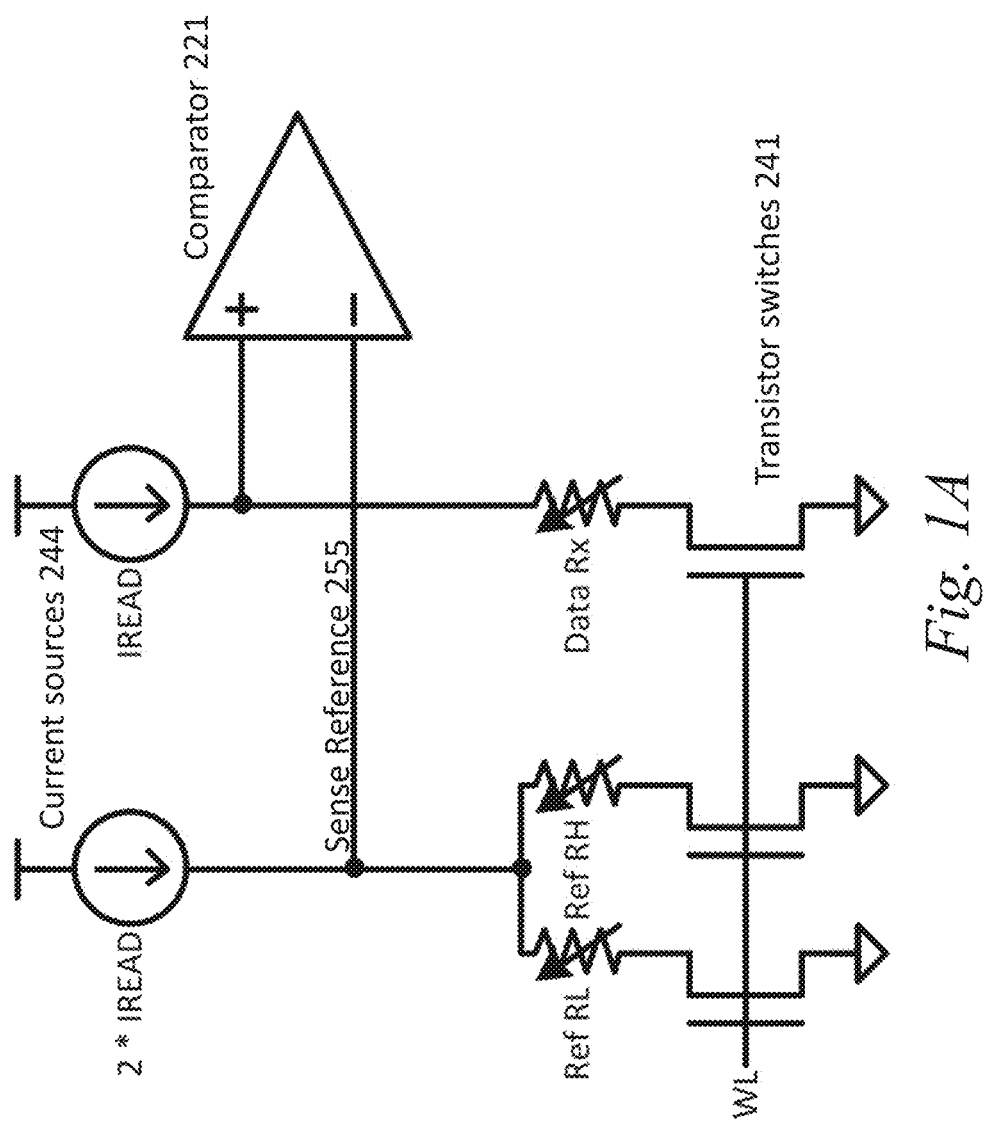
FIG. 1A is a diagram depicting one embodiment of a system for sense reference generation for MTJ based memories.

The details of various embodiments of the methods and systems are set forth in the accompanying drawings and the description below.

DETAILED DESCRIPTION

Although this disclosure can reference aspects of various standard(s) and specification(s), the disclosure is in no way limited to these aspects.

Described herein are systems and methods for generating sense reference for magnetic tunnel junction (MTJ) based memories. Many implementations for providing a sense reference are area and/or power intensive, and/or create challenges in matching RC time constants between data cells and reference cells, in one or more embodiments. Variation in resistances of reference cells result in unreliable sense references for the determination of data values stored in MTJ cells, in one or more embodiments. Averaging voltages across many reference cells (e.g., across a row of cells) can help create a stable reference, while these reference cells can be shared across different data cells, in one or more embodiments. This averaging is implemented by shorting lines or connections of reference cells together before entering a comparator input, in one or more embodiments. Two matched arrays of cells could be implemented to allow location-based pairing of data cells on one array with reference cells on another array, and vice versa, in one or more embodiments. This reduces area and/or power overheads, in one or more embodiments.

In one or more embodiments, a magnetoresistive random access memory (MRAM) architecture in which two matched arrays are used per block of MTJ cells are described in this disclosure. In one or more embodiments, a reference row of cells from a first array, selected for a data bit cell from a second array being read, has reference lines or connections that are shorted together prior to entering an input of a comparator. In one or more embodiments, the shorted reference lines of the cells from the reference row provide averaging of voltages, and provides a RC time constant matched with that of a corresponding data bit cell. By way of a brief overview, the following aspects are discussed prior to a more detailed description.

In one or more aspects, this disclosure is directed to a system for sense reference generation. In one or more embodiments, the system includes a first array and a second array of MTJ based cells configured as a magnetoresistive random access memory block. In one or more embodiments, the first array is matched to the second array, the first array and the second array each including rows of MTJ based cells for storing data bits. In one or more embodiments, wherein responsive to a first row of MTJ based cells in the first array being selected for at least a first stored data bit to be read, the second array is configured to connect a reference row of MTJ based cells in the second array to at least a first comparator of a plurality of comparators via reference lines, to provide sense reference for determining a value of the first stored data bit. In one or more embodiments, the reference lines are shorted together prior to connecting to a first input of the first comparator.

In one or more embodiments, the reference row in the second array is pre-assigned to a plurality of rows of MTJ based cells in the first array including the first row of MTJ based cells. In one or more embodiments, the row in the second array is selected to provide the sense reference, the reference row selected for having a position in the second array that is most similar to that of the first row within the first array. In one or more embodiments, the plurality of comparators individually provides matched bias and loading conditions to the reference lines and data lines of the first row of MTJ based cells in the first array. In one or more embodiments, each of the reference lines are connected via a respective multiplexer to a respective comparator, the reference lines being shorted across the respective multiplexers prior to connecting to the first input of the plurality of comparators.

In one or more embodiments, the first stored data bit is stored in a first MTJ based cell that connects to a second input of the first comparator via a first data line. In one or more embodiments, a resistance-capacitance (RC) time constant of the first data line is matched with that of the reference lines. In one or more embodiments, the sense reference is provided via averaging of voltages induced across resistances of the MTJ based cells in the reference row. In one or more embodiments, each MTJ based cell of the reference row is separately set to either a low resistance or a high resistance state to achieve a desired average voltage for sense reference. In one or more embodiments, the reference row includes at least one error correction coding (ECC) cell or repair cell participating in the averaging of voltages.

In one or more aspects, this disclosure is directed to a method for sense reference generation. In one or more embodiments, the method includes selecting a first row of magnetic MTJ based cells in a first array of MTJ based cells for at least a first stored data bit to be read. In one or more embodiments, responsive to the selection, a reference row of MTJ based cells from a second array of MTJ based cells is connected to at least a first comparator of a plurality of comparators via reference lines, to provide a sense reference for determining a value of the first stored data bit, the reference lines being shorted together prior to connecting to a first input of the first comparator. In one or more embodiments, the first array and the second array of MTJ based cells are implemented as a magnetoresistive random access memory block. In one or more embodiments, the first array is matched to the second array, the first array and the second array each including rows of MTJ based cells for storing data bits.

In one or more embodiments, the reference row in the second array is pre-assigned to a plurality of rows of MTJ based cells in the first array including the first row of MTJ based cells. In one or more embodiments, the reference row in the second array is selected to provide the sense reference, the reference row selected for having a position in the second array that is most similar to that of the first row within the first array. In one or more embodiments, each of the reference lines is connected via a respective multiplexer to a respective comparator, wherein the reference lines are shorted across the respective multiplexers prior to connecting to the first input of the first comparator. In one or more embodiments, a first MTJ based cell having the first stored data bit is connected to a second input of the first comparator via a first data line. In one or more embodiments, the sense reference is provided via averaging of voltages induced across resistances of the MTJ based cells in the reference row.

In one or more aspects, this disclosure is directed to a system for providing sense reference. In one or more embodiments, the system includes a first array and a second array of MTJ based cells each including rows of MTJ based cells for storing data bits. In one or more embodiments, wherein responsive to a first row of MTJ based cells in the first array being selected for at least a first stored data bit to be read, a reference row of MTJ based cells in the second array is connected to a first comparator via reference lines that are shorted together prior to connecting to a first input of the first comparator. In one or more embodiments, wherein the reference row in the second array is selected to provide the sense reference, the reference row selected for having a position in the second array that is most similar to that of the first row within the first array. In one or more embodiments, each of the reference lines are connected via a respective multiplexer to a respective comparator, the reference lines being shorted across the respective multiplexers prior to connecting to the first input of the first comparator.

In one or more embodiments, the present methods and systems provide a solution for implementing high density MRAM designs. In one or more embodiments, data in MRAM is not stored as electric charge or current flows, but by magnetic storage elements. In one or more embodiments, the magnetic storage elements are formed from two ferromagnetic plates for instance, each of which can hold a magnetization, separated by a thin insulating layer for example. In one or more embodiments, one of the two plates is a permanent magnet held or set to a particular polarity. In one or more embodiments, the other plate has magnetization that could be adjusted or modified to correspond to an external field to store data. This configuration is sometimes known as a Magnetic tunnel junction, and may be referred to as a cell or a MTJ based cell. A MRAM-based memory device is built from a grid or array of such cells.

In one or more embodiments, reading data from a cell is accomplished by measuring the electrical resistance of the cell. In one or more embodiments, a certain cell is selected by powering an associated transistor that switches current from a supply line through the cell to ground. Due to the tunnel magnetoresistance, the electrical resistance of the cell changes due to the relative orientation of the magnetization in the two plates. By measuring the resulting voltage and/or current, the resistance inside the cell can be determined, and the magnetization polarity of the writable plate determined according to the resistance. In one or more embodiments, if the two plates have the same magnetization alignment (e.g., low resistance state) the stored data is considered to represent "1". In one or more embodiments, if the alignment is antiparallel the resistance shall be higher (e.g., high resistance state) and the stored data is considered to represent "0".

In one or more embodiments, the present methods and systems provide or generate a reference voltage level for comparing against a data cell. The reference voltage level is sometimes referred to as sense reference, and corresponds to a voltage induced over one or more resistances of one or more reference cells, in one or more embodiments. In one or more embodiments, the sense reference is applied to one input of a comparator, and a voltage level representing data (e.g., induced over a resistance of a cell storing the data) is applied to another input of the comparator for comparison against the sense reference. In one or more embodiments of the present systems and methods, the sense reference is at least one of: trimmable, low power, low overhead, or allows PVT (power, voltage and/or temperature) tracking. The sense reference is used for comparison due to variations (e.g., in PVT) in data storage cells, in one or more embodiments.

Referring now to FIG. 1A, one embodiment of a system for generating sense reference is depicted. The system includes a comparator 221, current sources 244, and/or transistor switches 241 to channel current from the current sources through the cells to ground, in one or more embodiments. The cells include a cell that is storing data (corresponding to Data Rx), and one or more reference cells storing reference data or signals (e.g., corresponding to Ref RL and Ref RH). In one or more embodiments, the reference cells include a first cell type providing a reference low level (RL), and a second cell type providing a reference high level (RH). The system uses one cell of each cell type for example, so that the resulting sense reference voltage 255 is about the average of, or halfway between what one would expect for RL versus RH data states, in one or more embodiments.

Figure 1B:
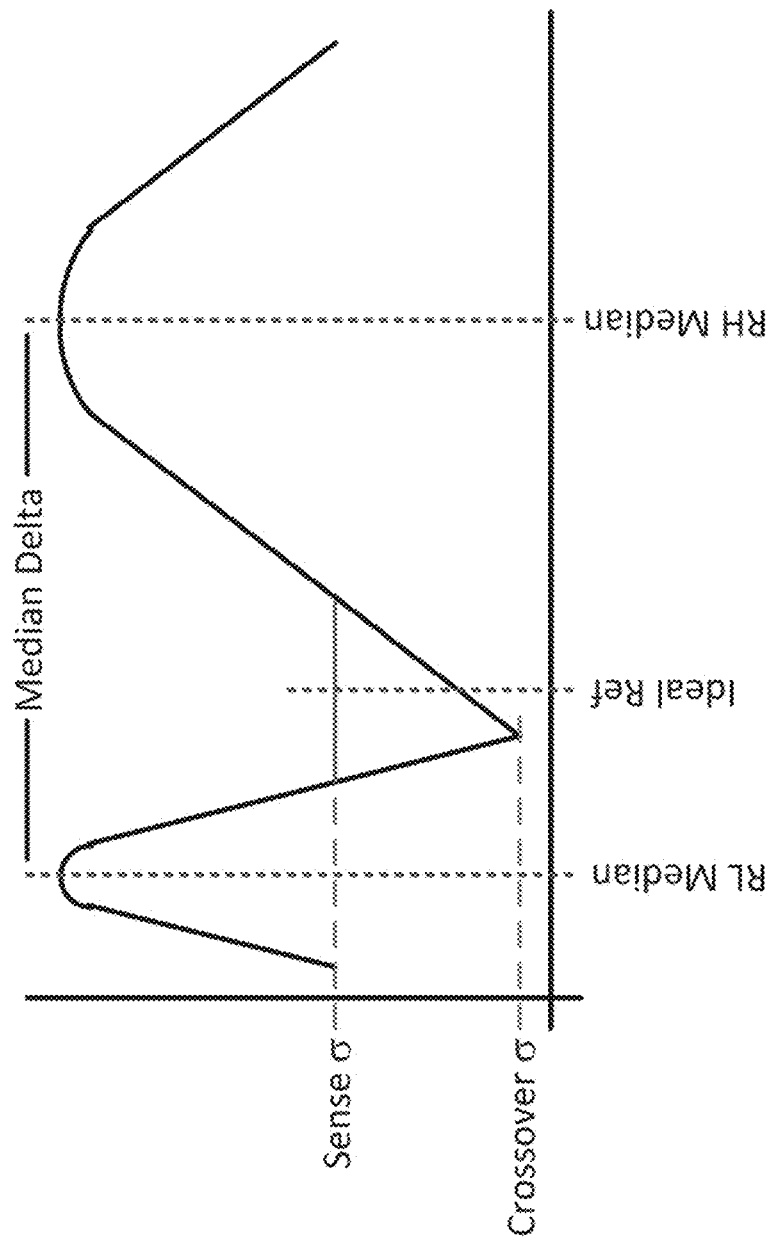
FIG. 1B is a diagram illustrating variations in distributions of RH and RL levels.

Using the two reference cells doubles the current (e.g., 2*Iread), in one or more embodiments. This system is able to provide PVT tracking, but could be area intensive, relatively high power (e.g., corresponding to the 2*Iread, in addition to Iread through the data cell), and could be difficult to match the data and reference RC time constants. Due to variations in the resistance of reference MTJ cells, a sense reference derived from the resulting average might also have a high variation, in one or more embodiments. In general, MTJ cells implemented with two states might suffer from high failure or error probability. In one or more embodiments, and as shown in FIG. 1B by way of illustration, variations in MTJ cells yield distributions of RH and RL levels with high standard variations ($\sigma$). Thus, MTJ cells used as reference cells might suffer from high standard variations relative to an available data signal.

Figure 1C:
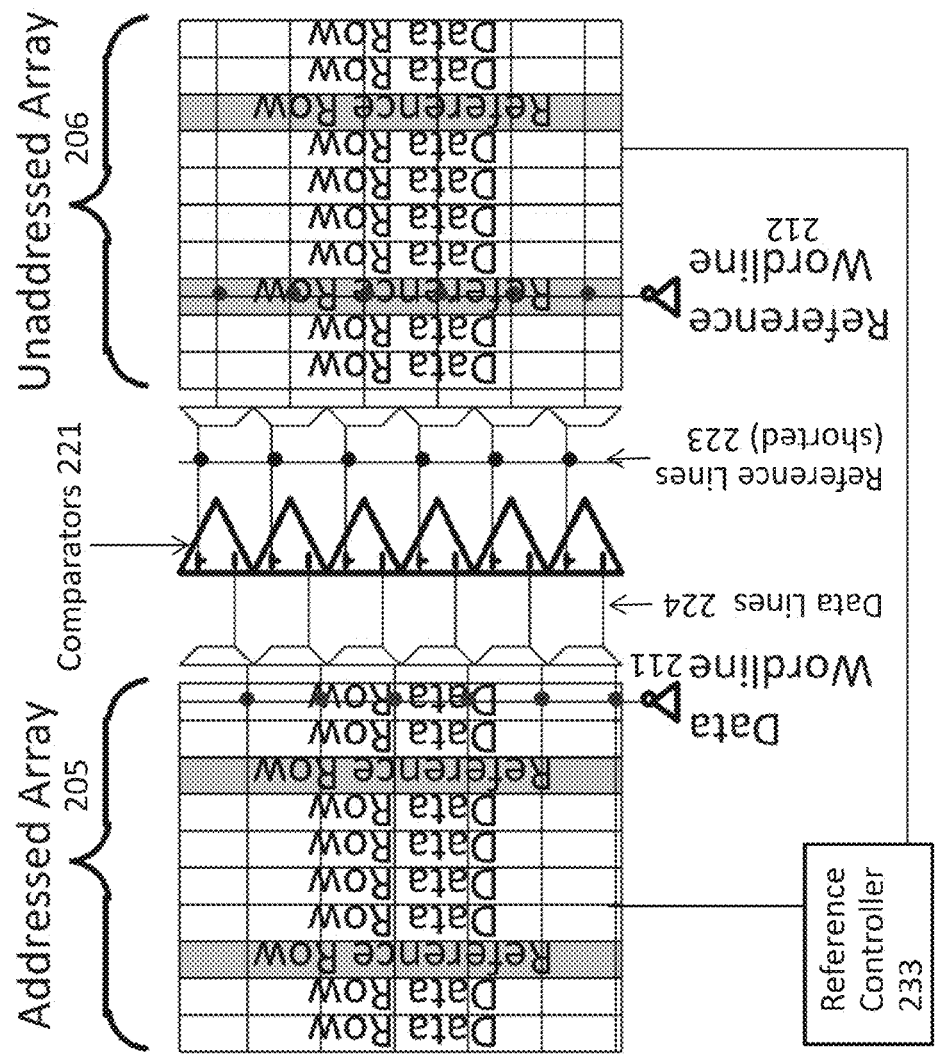
FIG. 1C is a diagram depicting another embodiment of a system for sense reference generation for MTJ based memories.

Referring now to FIG. 1C, another embodiment of a system for sense reference generation is depicted. In brief overview, two matched arrays of MTJ cells are used to implement a block of memory. Each array includes one or more rows of MTJ cells, which can be addressed for read and/or write operations for example, in one or more embodiments. Each array is coupled to a plurality of comparators, so that a number of cells from a first array are selected to provide sense reference, and one or more cells from a second array are identified for read operations. For instance, a reference row of cells from a first array, selected for one or more data bit cells from a second array being read, has reference lines that are shorted together prior to entering an input of a comparator 221. A data line of a first data bit cell is connected to another input of the comparator 221 so that a determination of a data value stored in the first data bit cell could be made, in one or more embodiments.

In one or more embodiments, the shorted reference lines of the cells from the reference row provide averaging of voltages, and could provide a sense reference that is stable and less susceptible to variation (e.g., of cell fabrication process). In one or more embodiments, the same sense reference is used for comparing against voltage levels from one or more other data cells using one or more other comparators, for example, in concurrent multi-bit read operations. Thus, a single sense reference (instead of multiple reference voltage levels), from averaging out variations across multiple reference cells, is shared and used for determining data values stored in multiple data cells, in one or more embodiments. This sharing provides a less area intensive solution for sense reference generation in one or more embodiments, because the ratio of reference cells to data cells could be kept low (e.g., 1:1, instead of 2:1 according to the example embodiment in FIG. 1A).

In one or more embodiments, the shorted reference lines of the cells from the reference row provide a RC time constant matched with that of a corresponding data bit cell. For instance, by using X number of reference cells (e.g., in parallel configuration) instead of a single reference cell, which translates to an effective capacitance that is X times that of the single cell, and an effective resistance that is 1/X that of the single cell, the resultant RC time constant is matched to that of the single reference cell, as well as that of a single data cell.

Referring again to FIG. 1C, and by way of illustration, a first data row or wordline 211 is addressed or identified for a read operation, in one or more embodiments. A reference controller 233, in one or more embodiments, receives, detects or intercepts an address of the first data row 211 as part of the read operation. The reference controller 233 includes at least one of circuitry, a memory or a processor, alone or in combination, specially designed and/or implemented to perform the operations described herein. In one or more embodiments, the reference controller 233 coordinates between, manages, or controls sense reference generation for the read operation. The reference controller 233, in one or more embodiments, manages the selection and/or connection of the first data row of cells to the plurality of comparators, responsive to the first data row 211 (or its address) being identified for the read operation. For instance, the reference controller 233 is able to switch a transistor to connect a current source of a first addressed data cell through its resistance to the ground, in one or more embodiments. The reference controller 233, in one or more embodiments, manages multiplexers that connect respective data lines associated with the data row of cells, with respective comparators 221. The reference controller 233 sends signals or instructions to input selection ports of one or more multiplexers to connect data lines from the addressed array with one or more comparators 221.

In one or more embodiments, the reference controller 233 manages the selection and/or connection of a reference row of cells 212 from the unaddressed array 206, to the plurality of comparators. In one or more embodiments, the reference controller 233 selects the reference row 212 according to, or using the address of the identified data row 211. This provides a level of PVT matching between the reference cells and the data cells selected from their respective arrays, since the arrays are matched. For instance, and in one or more embodiments, the reference controller 233 selects a reference row 212 that is at least approximate in address or location (e.g., relative to the associated comparators), as that of the selected data row 211. The reference controller 233 selects a reference row 212 that is located about the same distance as the selected data row 211 is to the comparators 221, in one or more embodiments. The reference controller 233 selects a reference row that is most similar in distance to the comparators 221, as that of the selected data row, to ensure good PVT matching for instance.

In one or more embodiments, the reference controller 233 manages the connection of the reference row of cells to the plurality of comparators. For instance, the reference controller 233 is able to switch a transistor to connect a current source of a first reference cell through its resistance to the ground, in one or more embodiments. The reference controller 233, in one or more embodiments, manages or controls multiplexers that connect reference lines 223 associated with the reference row of cells 212, with the comparators 221. The reference controller 233 sends signals or instructions to input selection ports of one or more multiplexers to connect the reference lines 223 from the unaddressed array 206 to the comparators 221, in one or more embodiments. The reference lines 223 are shorted, or connected together, prior to connecting to the one or more comparators 221, in one or more embodiments. The reference lines are shorted together across the whole array prior to entering a first comparator, in one or more embodiments.

The shorting of the reference lines 223 results in wired averaging of voltage levels induced by each of the reference cells, in one or more embodiments. Thus, voltage levels from many reference cells are averaged together, and a single resultant sense reference is shared for use with a number of data cells, in one or more embodiments. The reference cells can be uniquely trimmed to optimize the read margin (e.g., during test) or a fixed ratio can be used for reduced complexity, in one or more embodiments. For instance, each of the reference cells can be separately trimmed to achieve a particular sense reference and/or RC constant. For example, for read bandwidths of 16 bits or more, trim precision could be achieved to within less than 10% of a target, or the standard variation of cells in a fixed ratio reference could be reduced by four times, in one or more embodiments.

In one or more embodiments, ECC and/or repair cells are incorporated into the matched array, for example to improve read bandwidth via error correction and/or replacement of inactive/damaged cells. For instance, a 32 bit data row configuration could be extended to 38 bits including ECC and/or repair cells. A corresponding reference row would have 38 cells for averaging to generate sense reference for data bit determination, in one or more embodiments. In one or more embodiments, a reference row can be included or assigned for a specified or variable number of data rows in each array (e.g., per every 128 data rows, resulting in less than 1% overhead).

Figure 1D:
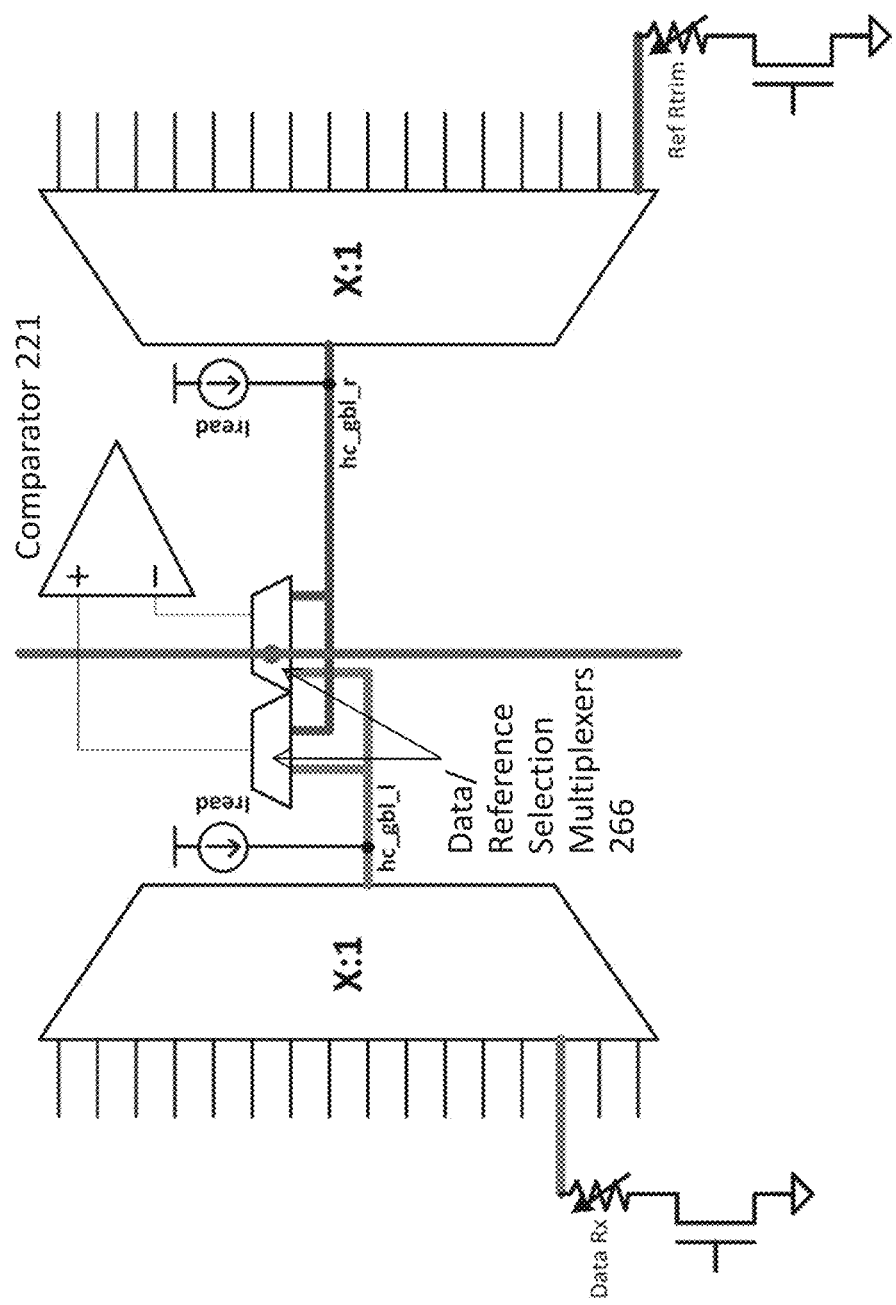
FIG. 1D is a diagram depicting an embodiment of a system for sense reference generation for MTJ based memories.

Referring now to FIG. 1D, one embodiment of a system for sense reference generation is depicted. In one or more embodiments, FIG. 1D provides more details of circuitry that can be used in the configuration of FIG. 1C. For instance, a first comparator is depicted with two data/reference selection multiplexers 266, which allows any of two arrays to be addressable for data reads, while the other array provides reference cells for sense reference generation, in one or more embodiments. The large column multipliers represent the corresponding groups of multiplexors connecting the addressed and unaddressed arrays to the comparator 221, in one or more embodiments. The connections through each of the column multiplexers indicate how one data or reference cell is connected to the comparator 221. The vertical line, with a connection/short to the reference line extending through one of the data/reference selection multiplexers 266, provides shorting of multiple reference lines 223, for example as discussed above in connection with FIG. 1C.

In one or more embodiments, a current Iread flows through the reference cell, and a current Iread flows through the data cell, as illustrated in FIG. 1D. As such, power consumed is based on 2*Iread, which is less than that for the embodiment discussed in FIG. 1A, for example.

Figure 1E:
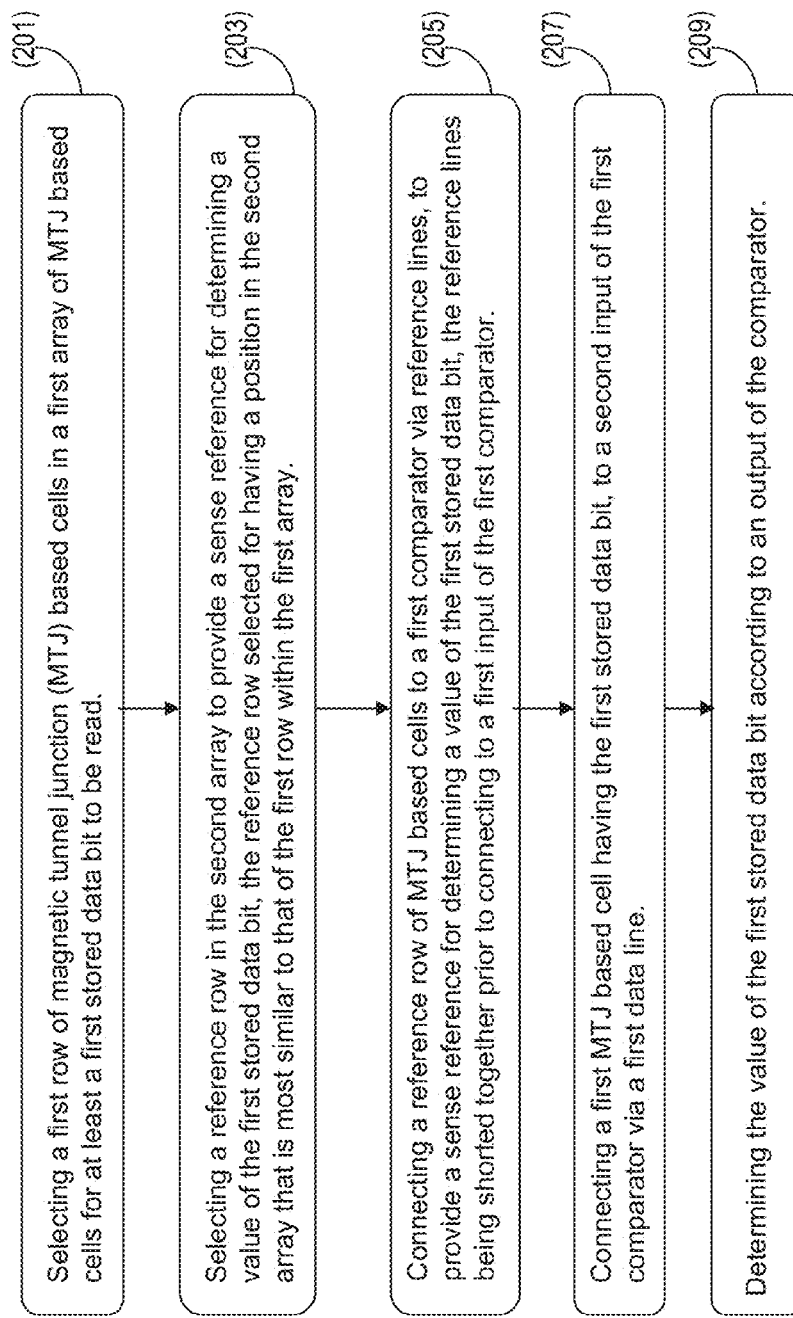
FIG. 1E is a flow diagram of an embodiment of a method for sense reference generation for MTJ based memories.

Referring now to FIG. 1E, one embodiment of a method for sense reference generation is depicted. In brief overview, the method includes selecting a first row of magnetic MTJ based cells in a first array of MTJ based cells for at least a first stored data bit to be read (operation 201). A reference row in the second array is selected to provide a sense reference for determining a value of the first stored data bit, the reference row selected for having a position in the second array that is most similar to that of the first row within the first array (operation 203). A reference row of MTJ based cells is connected to a first comparator via reference lines, to provide a sense reference for determining a value of the first stored data bit, the reference lines being shorted together prior to connecting to a first input of the first comparator (operation 205). A first MTJ based cell having the first stored data bit is connected to a second input of the first comparator via a first data line (operation 207). The value of the first stored data bit is determined according to an output of the comparator (operation 209).

Referring now to operation 201, and in some embodiments, a reference controller 233 selects a first row of MTJ based cells in a first array of MTJ based cells for at least a first stored data bit to be read. In one or more embodiments, the first stored data bit is stored in a first MTJ based cell that connects to a first input of the first comparator via a first data line. The first row of MTJ based cells is sometimes referred to herein as a data row of cells, a first data row or a first wordline 211.

The first array is matched to a second array, in one or more embodiments. Each array includes one or more rows of MTJ based cells, which can be addressed for read and/or write operations for example, in one or more embodiments. Each array is coupled to a plurality of comparators, so that a number of cells from a first array are selected to provide sense reference, and one or more cells from a second array are identified for read operations. For instance, a reference row of cells from the second array, selected for one or more data bit cells from a first array being read, has reference lines that are shorted together prior to entering an input of the first comparator. A data line of a first data bit cell is connected to another input of the first comparator so that a determination of a data value stored in the first data bit cell could be made, in one or more embodiments.

In one or more embodiments, the first data row or wordline 211 is addressed or identified for a read operation. A reference controller 233 for instance, in one or more embodiments, receives, detects or intercepts an address of the first data row 211 as part of the read operation. The reference controller 233, in one or more embodiments is designed and/or implemented to perform one or more operations of the method. The reference controller 233, in one or more embodiments, manages the selection and/or connection of the first data row of cells to the plurality of comparators, responsive to the first data row 211 (or its address) being identified for the read operation. For instance, the reference controller 233 is able to switch a transistor to connect a current source of a first addressed data cell through its resistance to the ground, in one or more embodiments. The reference controller 233, in one or more embodiments, manages multiplexers that connect respective data lines associated with the data row of cells, with respective comparators 221. In one or more embodiments, the reference controller 233 sends signals or instructions to input selection ports of one or more multiplexers to connect data lines from the addressed array with one or more comparators 221.

Referring now to operation 203, and in some embodiments, the reference controller 233 selects a reference row in the second array to provide a sense reference (voltage level) for determining a value of the first stored data bit. The two matched arrays of cells could be implemented to allow location-based pairing of the first row of cells in the first array with a reference row of cells in the second array, and vice versa, in one or more embodiments. In one or more embodiments, the reference row is selected (e.g., from available reference rows) for having a position in the second array that is most similar to that of the first row within the first array (e.g., relative to one or more comparators). In one or more embodiments, the reference controller 233 selects the reference row 212 according to, or using the address of the identified data row 211. In one or more embodiments, this provides a level of PVT matching between the reference cells and the data cells selected from their respective arrays, since the arrays are matched. For instance, and in one or more embodiments, the reference controller 233 selects a reference row 212 that is at least approximate in address or location (e.g., relative to the associated comparators), as that of the selected data row 211. The reference controller 233 selects a reference row 212 that is located about the same distance as the selected data row 211 is to the comparators 221, in one or more embodiments. The reference controller 233 selects a reference row that is most similar in distance to the comparators 221, as that of the selected data row, to ensure good PVT matching for instance. In one or more embodiments, the reference row in the second array is selected to provide the sense reference, the reference row selected for having a position in the second array that is most similar to that of the first row within the first array.

In one or more embodiments, the reference row in the second array is pre-assigned or allocated to a plurality of rows of MTJ based cells in the first array including the first row of MTJ based cells. The first comparator is connected to two data/reference selection multiplexers 266, which allow any one of the two arrays to be addressable for data reads, while the other array provides reference cells for sense reference generation, in one or more embodiments. In one or more embodiments, each of the reference lines is connected via a respective multiplexer to a respective comparator, the reference lines being shorted across the respective multiplexers prior to connecting to the first input of the plurality of comparators. For instance, a wire or connector, with a connection/short to a reference line extending through or within one of the data/reference selection multiplexers 266, provides shorting of multiple reference lines 223.

Referring now to operation 205, and in some embodiments, the reference controller 233 causes to connect a reference row of MTJ based cells to the first comparator via reference lines, to provide a sense reference for determining a value of the first stored data bit. In one or more embodiments, the reference lines are shorted together prior to connecting to a first input of the first comparator. Variation in resistances of reference MTJ based cells result in unreliable sense references for the determination of data values stored in MTJ cells of the data row, in one or more embodiments. Averaging voltages across many reference cells (e.g., across a row of cells) can help create a stable reference, while sharing the reference cells across each different data cells, in one or more embodiments. In one or more embodiments, the shorted reference lines of the cells from the reference row provide averaging of voltages, and could provide a sense reference that is stable and less susceptible to variation (e.g., of cell fabrication process). The shorting of the reference lines 223 results in wired averaging of voltage levels induced by each of the reference cells, in one or more embodiments. This averaging is implemented by shorting the lines of reference cells together before entering a comparator input, in one or more embodiments. The reference lines are shorted together across the whole array prior to entering the first comparator, in one or more embodiments.

In one or more embodiments, the same sense reference is used for comparing against voltage levels from one or more other data cells (e.g., of the first row) using one or more other comparators, for example, in concurrent multi-bit read operations. Thus, a single sense reference (instead of multiple reference voltage levels), from averaging out variations across multiple reference cells, is shared and used for determining data values stored in multiple data cells, in one or more embodiments.

Referring now to operation 207, and in some embodiments, the reference controller 233 causes to connect a first MTJ based cell having the first stored data bit, to a second input of the first comparator via a first data line. The data line of a first data bit cell is connected to the second input of the comparator so that a determination of a data value stored in the first data bit cell can be made, in one or more embodiments. in one or more embodiments, the reference controller 233 causes to connect other MTJ based cell having stored data bits, to respective second inputs of other comparators via corresponding data lines. In one or more embodiments, the plurality of comparators individually provides matched bias and/or loading conditions to the reference lines and data lines of the first row of MTJ based cells in the first array. In one or more embodiments, a RC time constant of the first data line is matched with that of the reference lines.

Referring now to operation 209, and in some embodiments, the reference controller 233 determines the value of the first stored data bit according to an output of the comparator. In one or more embodiments, the sense reference is provided via averaging of voltages induced across resistances of the MTJ based cells in the reference row. In one or more embodiments, each MTJ based cell of the reference row may be separately set to either a low resistance or a high resistance state to achieve a desired average voltage for sense reference In one or more embodiments, the shorted reference lines of the cells from the reference row provide averaging of voltages, and provide a sense reference that is stable and less susceptible to variation. In one or more embodiments, the same sense reference is used for comparing against voltage levels from one or more other data cells using one or more other comparators, for example, in concurrent multi-bit read operations. Thus, a single sense reference (instead of multiple reference voltage levels), from averaging out variations across multiple reference cells, is shared and used for determining data values stored in multiple data cells, in one or more embodiments. This sharing provides a less area intensive solution for sense reference generation in one or more embodiments, because the ratio of reference cells to data cells could be kept low.

It should be noted that certain passages of this disclosure can reference terms such as "first" and "second" in connection with devices (e.g., comparators, row of cells), signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A system for sense reference generation, the system comprising:

a first array and a second array of magnetic tunnel junction (MTJ) based cells configured as a magnetoresistive random access memory block, the first array matched against process, voltage and temperature (PVT) variation to the second array, the first array and the second array each comprising rows of MTJ based cells for storing data bits, wherein responsive to a first row of MTJ based cells in the first array being selected for at least a first stored data bit to be read, the second array is configured to connect a reference row of MTJ based cells in the second array to at least a first comparator of a plurality of comparators via reference lines, to provide sense reference for determining a value of the first stored data bit, wherein each of the reference lines is connected via a respective multiplexer to a respective comparator, the reference lines being shorted together, via contact with an electrical connector passing through the respective multiplexers prior to connecting to a first input of the first comparator.

2. The system of claim 1, wherein the reference row in the second array is pre-assigned to a plurality of rows of MTJ based cells in the first array including the first row of MTJ based cells.

3. The system of claim 1, wherein the reference row in the second array is selected to provide the sense reference, the reference row selected for having a position in the second array that is most similar to that of the first row within the first array.

4. The system of claim 1, wherein the plurality of comparators individually provides matched bias and loading conditions to the reference lines and data lines of the first row of MTJ based cells in the first array.

5. The system of claim 1, wherein each of the respective multiplexers comprises a 2-to-1 multiplexer.

6. The system of claim 1, wherein the first stored data bit is stored in a first MTJ based cell that connects to a second input of the first comparator via a first data line.

7. The system of claim 6, wherein a resistance-capacitance (RC) time constant of the first data line is matched with that of the reference lines.

8. The system of claim 1, wherein the sense reference is provided via averaging of voltages induced across resistances of the MTJ based cells in the reference row.

9. The system of claim 8, wherein the reference row includes at least one error correction coding (ECC) cell or repair cell participating in the averaging of voltages.

10. The system of claim 1, wherein each MTJ based cell of the reference row may be separately set to either a low resistance or a high resistance state to achieve a desired average voltage for sense reference.

11. A method for sense reference generation, the method comprising:

selecting a first row of magnetic tunnel junction (MTJ) based cells in a first array of MTJ based cells for at least a first stored data bit to be read; and connecting, responsive to the selection, a reference row of MTJ based cells from a second array of MTJ based cells to at least a first comparator of a plurality of comparators via reference lines, to provide a sense reference for determining a value of the first stored data bit, wherein each of the reference lines is connected via a respective multiplexer to a respective comparator, the reference lines being shorted together, via contact with an electrical connector passing through the respective multiplexers prior to connecting to a first input of the first comparator, wherein the first array and the second array of MTJ based cells are configured as a magnetoresistive random access memory block, and the first array is matched against process, voltage and temperature (PVT) variation to the second array, the first array and the second array each comprising rows of MTJ based cells for storing data bits.

12. The method of claim 11, wherein the reference row in the second array is pre-assigned to a plurality of rows of MTJ based cells in the first array including the first row of MTJ based cells.

13. The method of claim 11, further comprising selecting the reference row in the second array to provide the sense reference, the reference row selected for having a position in the second array that is most similar to that of the first row within the first array.

14. The method of claim 11, wherein each of the respective multiplexers comprises a 2-to-1 multiplexer.

15. The method of claim 11, further comprising connecting a first MTJ based cell having the first stored data bit, to a second input of the first comparator via a first data line.

16. The method of claim 15, wherein a resistance-capacitance (RC) time constant of the first data line is matched with that of the reference lines.

17. The method of claim 11, further comprising providing the sense reference via averaging of voltages induced across resistances of the MTJ based cells in the reference row.

18. A system for providing sense reference, the system comprising:

a first array and a second array of magnetic tunnel junction (MTJ) based cells each comprising rows of MTJ based cells for storing data bits, wherein responsive to a first row of MTJ based cells in the first array being selected for at least a first stored data bit to be read, a reference row of MTJ based cells in the second array is connected to a first comparator via reference lines, wherein each of the reference lines is connected via a respective multiplexer to a respective comparator, and the reference lines are shorted together via contact with an electrical connector passing through the respective multiplexers prior to connecting to a first input of the first comparator.

19. The system of claim 18, wherein the reference row in the second array is selected to provide the sense reference, the reference row selected for having a position in the second array that is most similar to that of the first row within the first array.

20. The system of claim 18, wherein each of the respective multiplexers comprises a 2-to-1 multiplexer.

* * * * *